United States Patent
Ausschnitt et al.

(10) Patent No.: US 6,346,979 B1
(45) Date of Patent: *Feb. 12, 2002

(54) PROCESS AND APPARATUS TO ADJUST EXPOSURE DOSE IN LITHOGRAPHY SYSTEMS

(75) Inventors: Christopher P. Ausschnitt, Brookfield, CT (US); Scott M. Mansfield, Hopewell Junction, NY (US); Mark O. Neisser, East Greenwich, RI (US); Christopher D. Wait, Beacon, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/270,696

(22) Filed: Mar. 17, 1999

(51) Int. Cl.⁷ .................. G03B 27/42; G03B 27/54; G03B 27/72
(52) U.S. Cl. .................. 355/53; 355/67; 355/69
(58) Field of Search .................. 355/35, 53, 67, 355/68, 69, 71, 70; 430/5, 20, 30; 359/562, 559, 565, 615, 900, 399

(56) References Cited

U.S. PATENT DOCUMENTS

| | | | |
|---|---|---|---|
| 5,194,893 A | 3/1993 | Nishi | 355/53 |
| 5,473,410 A | 12/1995 | Nishi | 355/53 |
| 5,477,304 A | 12/1995 | Nishi | 355/53 |
| 5,602,619 A | 2/1997 | Sogard | 355/53 |
| 5,617,182 A | 4/1997 | Wakamoto et al. | 355/53 |
| 5,644,383 A | 7/1997 | Mori | 355/68 |
| 5,712,674 A * | 1/1998 | Doi | 347/238 |
| 5,895,737 A * | 4/1999 | McCullough et al. | 430/30 |
| 5,966,202 A * | 10/1999 | McCullough | 355/67 |
| 6,097,474 A * | 8/2000 | McCullough et al. | 355/69 |
| 6,101,034 A * | 8/2000 | Cox et al. | 359/562 |

FOREIGN PATENT DOCUMENTS

JP  09-082633  3/1997

* cited by examiner

Primary Examiner—Russell Adams
Assistant Examiner—R. Fuller
(74) Attorney, Agent, or Firm—Ratner & Prestia; Tiffany L. Townsend, Esq.

(57) ABSTRACT

A process and apparatus for dynamically adjusting the exposure dose on a photosensitive coating at a localized area within an exposure field in a step-and-scan lithography system. The process and apparatus form a pattern on a photosensitive substrate, such as used in the integrated circuit manufacturing industry. The exposure dose is adjusted at a localized area by a segmented slit system or an array of light-transmitting pixels located across the exposure field. The slit segments or individual pixels are automatically controlled in response to data obtained regarding the uniformity of the projection optics system or the mask pattern.

36 Claims, 7 Drawing Sheets

PROCESS AND APPARATUS TO ADJUST EXPOSURE DOSE IN LITHOGRAPHY SYSTEMS

FIELD OF THE INVENTION

The present invention is directed to forming a pattern on a photosensitive substrate, such as used in the integrated circuit manufacturing industry, and to the apparatus for producing the pattern. More particularly, the present invention is directed to forming a pattern on a photosensitive coating in a step-and-scan lithography system, and includes a process and apparatus to adjust the exposure dose in a localized area by use of a segmented slit.

BACKGROUND OF THE INVENTION

Modern silicon technology uses photolithography techniques to manufacture integrated circuits (IC's) via photomasks. The photomasks are typically formed of an opaque pattern in a material such as chrome which is protected, by pellicles, from scratching and contamination. A pellicle is a thin sheet of clear material that is attached to the patterned material of the photomask so as to prevent foreign matter from contaminating the mask surface itself and thereby distorting the mask pattern. The pellicle precludes contaminating debris from the focal plane of the photomask pattern.

The substrate on which an integrated circuit is formed is called a wafer. Wafers are divided into individual integrated circuit sites called die. The critical dimensions of features of integrated circuits produced in the modern integrated circuit manufacturing industry are very small and continue to shrink. As these critical dimensions shrink, the degree of device complexity can be increased for a given die size.

The popular approach in photolithography is to expose each integrated circuit site (die) with a single mask pattern, then move to the next site, expose that site, and then move on repeating this process until each site has been exposed on the wafer. This is called "step and repeat." When a mask with a single pattern in a transfer region is used in a step-and-repeat process, the mask or photomask is referred to as a "reticle." Such use is favored because a one-to-one size ratio between the mask pattern and the pattern formed on the wafer is not favored, and modern photolithography equipment permits a mask image to be reliably, accurately, and repeatably reduced as it is formed on a substrate with a photosensitive coating. This procedure allows the mask pattern to be larger than the pattern actually produced on the integrated circuit. The mask image may be reduced by a factor which is commonly four or five times. For example, the image may be "stepped-down 4x" by a lens as the wafer site is exposed. As a result, the defects due to particle contamination, scratches, and other sources of defects on the mask surface are reduced, which correspondingly diminishes their deleterious effects.

In actual practice, control of the light exposure dose is important. A commonly implemented approach involves placing an opaque or light-interrupting barrier, having an aperture, between the light source and the mask or reticle. The aperture may be in the form of a slit. The slit is moved across the mask, thereby scanning the mask or reticle image from the transfer region and onto a site on the wafer, and exposing the photosensitive material coated on the wafer surface. After this scan process is completed at one site, the system is stepped over to another site on the wafer or substrate and the scan process is repeated. This is called the "step-and-scan" procedure.

When the exposure area or aperture formed within a light-interrupting member is a slit, the orientation of the slit is typically perpendicular to the scanning direction. For a given location along the length of the slit, the exposure dose projected onto the substrate being exposed depends upon the intensity of the light and the time the light source is projected through the slit and onto the substrate. For a given slit width, the exposure dose achieved on the substrate surface is increased as the scan speed is decreased. Conversely, for a given scan speed, the exposure dose achieved on the substrate surface is increased as the width of the slit is increased because the illumination impinges upon the substrate for a longer period of time.

In a step-and-scan system as described above, a number of problems exist. One relatively minor problem involves maintaining the intensity of the light dosage uniformly on the photosensitive substrate (wafer) throughout the exposure region. Unfortunately, the projection optics or illumination source may have non-uniformities which cause variation in the light dosage at the wafer surface. Although this particular variance due to the non-uniformity may be small, the critical nature of the application makes any non-uniformity significant and correction highly desirable.

Second, there may be non-uniformities in the processing used to produce the masks. Reactive ion etching (RIE) effects at the peripheries of individual die are such an example. These non-uniformities are static to the individual mask, but vary from mask-to-mask. The problem associated with this non-uniformity is that, for a given mask level, the exposure dosage would have to be adjusted throughout the scan based upon the specific mask used, which is undesirable. Suitable control of the exposure dose would allow compensation for these repeatable mask-to-mask non-uniformities.

A third problem is also related to the nature of mask manufacturing: some pattern defects may be present in the mask. Many of these pattern defects are repaired before the mask is put into use. There are defects, however, which as a practical matter cannot be repaired. This is generally due to the small size of the defects and also to proximity effects with respect to the other mask features. Appropriate control of the exposure field can partially correct for some of the pattern defects which fall into the category of uncorrectable mask defects.

Lastly, additional defects are introduced onto the masks, because the masks themselves are prone to problems associated with handling, including contamination and scratches. As above, appropriate control of the exposure field could also correct for many of the defects associated with mask handling. Furthermore, the elimination of masks by using a mask-less, direct-write optical photolithography system would circumvent all of the above problems associated with the photomasks or reticles.

SUMMARY OF THE INVENTION

To correct for the problems inherent in conventional systems and procedures, the present invention provides a process to dynamically adjust the exposure dose which reaches the photosensitive substrate at one position in the exposure field relative to other positions. The adjustment is made in response to system data obtained regarding mask defects and other system non-uniformities. The present invention addresses the shortcomings of the prior art by providing an adjusted exposure dose within the exposure field for the purpose of correction. The present invention provides an exposure apparatus having an exposure field with individually controllable features which provide for an adjusted light dosage within the exposure field.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
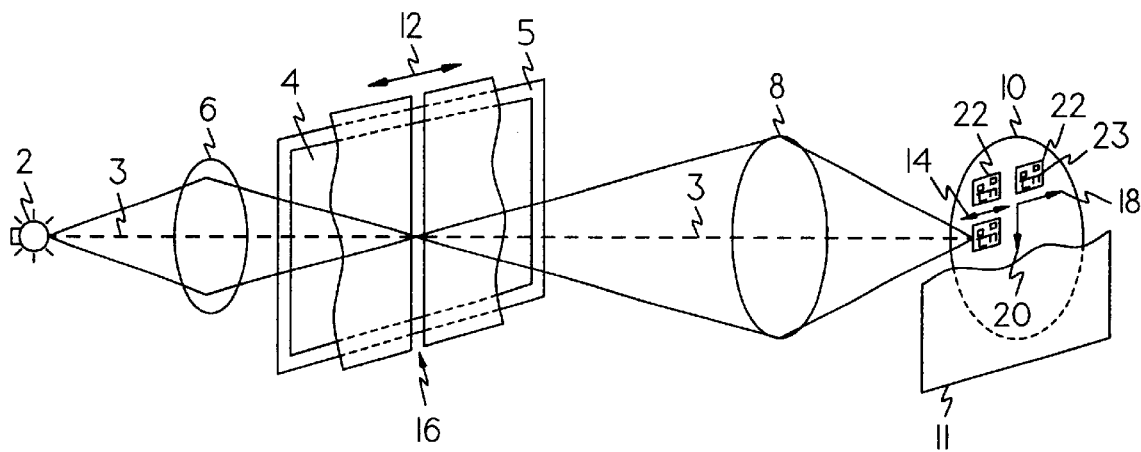
FIG. 1 is a perspective view of a conventional step-and-scan exposure system.

One aspect of the present invention is directed to compensating for systematic non-uniformities in projection optical or illumination systems and, more specifically, the intensity of the illumination which passes through the lens of the exposure system. Another aspect of the present invention is correcting for known or detected defects on a photomask or reticle. The present invention finds application in systems using both positive and negative photoresists. The apparatus and processes of the present invention may be used to increase dosage at a localized area within an exposure field or the apparatus and processes of the present invention may be used to decrease dosage at a location within an exposure field.

Non-Uniformities Within The Projection Optics System And The Illumination System The relatively minor non-uniformities associated with the projection optics and the light source tend to be more prevalent along the length of the slit, and perpendicular to the scan direction, but conditions can also exist where systematic variations occur along the scanning direction. Most variations along the length of the slit can be corrected by adjusting and setting the dose along the length of the slit in a static fashion and only on an occasional basis. A second condition requires the dose of light intensity to be varied as the reticle and photosensitive surface are scanned relative to the slit and the projection optics system.

Exposure dose adjustment may be achieved by varying the width of the slit, by adjusting the intensity of light passing through the slit, or by altering the scan speed. The illumination from the light source at the wafer plane is typically uniform to within a few percent, so correcting the dose across the slit by only a few percent sufficiently compensates for the variation in the optical system and the light source.

Dividing the length of the slit into 100 segments or less (even as few as 10) would suffice to capture the spatial extent of the dose non-uniformities associated with the lens. With a slit having a length of 80 mm at the mask plane, dividing the slit into 100 segments would require the segmentation to be such that each segment is approximately 800 microns in length. The width of a slit or aperture at the mask plane is typically about 20 mm, so a width adjustment of only 400–800 microns could completely correct for dose variations. When opposed sides of a slit each contain aligned displceable segments, total correction for these non-uniformities can be achieved by a lateral movement of 200–400 microns by each of a set of opposed slit segments.

In one embodiment, the light-interrupting slit segment is moved laterally into the slit or exposure area, decreasing the dose at that location. Alternatively, in another embodiment, the slit segment may be moved away laterally to effectively expand the exposure area and thus increase the dose at that location. The lateral displacement of the segmented sides of the slit could be accomplished in a number of ways including a bimorph bending actuator or other piezoelectric element attached to a deformable membrane, such as by use of a lever arm.

Liquid crystal elements in a matrix array (as in a Liquid Crystal Display or "LCD") may alternatively be used to adjust the light intensity passing through the slit and within the exposure field. The underlying concept is that of dividing slit or aperture sections into small, individually controllable shutters. This technique may be applied to either or both the lagging and leading sections within the slit with respect to the scan direction. In this embodiment, the pixel size of the liquid crystal array element is on the order of 200–400 microns in width. By blocking light through the individual LCD element, the same correction percentage as described above is similarly realized.

The liquid crystal matrix array is disposed between the light source and the slit. In the preferred embodiment the array is disposed immediately to the light-source side of the slit. Effectively, the array is disposed within the slit.

In an exemplary embodiment, the LCD array is orthogonal in arrangement and includes an axis along the scan direction. In this manner, the illumination reaching a wafer passes along each element within a row of the array as it moves along the scan direction. The individual elements of the LCD are appropriately polarized so as to block light from reaching the mask, or to allow light to project through and reach the mask. In effect, this technique is sectionalized shuttering. Starting at the edge of the slit and moving along the scan direction (across the slit), entire rows of elements may be turned on or off as needed, working towards the center of the slit, effectively increasing or decreasing the exposure dose achieved on the wafer surface as the light projecting through the slit reaches the wafer surface. Fine tuning is achieved by adjusting less than all of the elements in a row so as to modulate the edge. By modulating the edge in a step-like fashion, system non-uniformities can be corrected.

Correcting for Mask And Reticle Pattern Defects

The present invention also provides a process and apparatus that correct for known or detectable pattern defects on a photomask or reticle. As above, a reticle is a mask or photomask with a single step-and-repeat pattern within the transfer region. The apparatus and processes of the present invention may be used to increase dosage within a localized area within an exposure region in response to an opaque defect on a mask. Conversely, the apparatus and processes of the present invention may be used to decrease dosage at a location within an exposure region in response to a void in the opaque region of a mask pattern. Generally speaking, this issue of correcting for a mask defect is a more critical problem which has a more dramatic impact on pattern quality.

This application requires significantly smaller segment sizes on the order of the defect sizes on the reticle. An intensity variation of 10–20% is generally required to correct for the majority of reticle or photomask defects. Incomplete correction of a defect requires less intensity modulation yet significantly improves pattern integrity. The intensity variation may be optimized so that this process may be used to correct for defects either directly on the reticle, which are in focus and thus equally opaque, or for out-of-focus defects due to particles on the pellicle or on the opposite, unpatterned side of the reticle or mask. The intensity modulation needed to correct for variations due to mask or reticle defects may be accomplished in at least two different ways according to the present invention.

One process to correct for pattern defects is through the use of laterally displaceable light-interrupting slit segments formed along the edges of the slits which expand or restrict the exposure field, as described in conjunction with correcting for non-uniformities of the projection optics system and illumination system. A second process uses an array of individually controllable elements arranged across the exposure area and forming an array, also as described above. An array of liquid crystal elements may be used in the preferred embodiment. According to this process, the aperture includes non-deformable opaque edges and contains the liquid crystal array essentially across the slit or aperture itself. One approach uses an orthogonal array having an axis disposed along the scan direction, as described above.

For the fine-tuning adjustment needed to correct for smaller defects, a smaller pixel size is required within the liquid crystal array. It is not possible to produce pixel sizes which are as small as the typical defect sizes. Therefore, a further aspect of the present invention presents a process for achieving the fine tuning required for this spatial resolution.

One such approach is to orient a two-dimensional liquid crystal array placed across the slit at an angle relative to the scan direction. As the defect and the slit move relative to each other, by adjusting the intensity through several pixels, a smoother intensity distribution is achieved with increased modulation in a smaller area than would be possible using an orthogonal array of pixels aligned along a scan direction.

In one embodiment, all of the pixels will be only partially transmitting in their normal state, whereby the overall exposure dose through the slit may be increased or decreased as needed by increasing or decreasing the degree of transmissiveness through any or all of the individual pixels. In this manner, a finer intensity variation is achieved within the tilted array: certain pixels can be made brighter or darker to sharpen the peak. This result is best understood by considering that the dose that reaches any point on the photosensitive surface (wafer) is effectively the integral of the dose that passes through the entire width of the aperture or slit at a given location along the length of the slit.

Multiple Slit Embodiment

Another embodiment of the present invention includes the use of multiple slits. When the effective slit or aperture area is comprised of a series of smaller slits, each of the smaller slits requires less adjustment to achieve the same overall modulation. In the preferred embodiment, a plurality of parallel slits disposed perpendicular to the scan direction may be used.

Using slits made in thin piezo-electric ceramic with finely patterned electrodes, micron scale movements are achievable at micron-scaled dimensions. In this manner, a 10 to 20 percent intensity modulation may be achieved on a 10 micron wide slit. To match the intensity passing through a 20 mm wide slit, about 2,000 slits having 10-micron widths are needed. Diffraction effects due to this 10 micron wide grating are not substantial, but nonetheless must be considered.

Mask-Less Patterning

A further aspect of the apparatus and process of the present invention is their application within a maskless, or direct-write, optical lithography system. According to this aspect of the present invention, modulation as high as 100% may be achieved using features such as multiple slits of the LCD array as discussed above. Due to the non-linear response of most photoresists, modulation which is significantly less than 100% may be effectively used to form a pattern.

Data Collection Means

The present invention provides a process and apparatus to adjust the exposure dose in a localized area by the use of an adjustable segmented feature within the exposure field in a step-and-scan lithography exposure system. Information must be supplied to the exposure system to provide the basis for the dose adjustment.

In addition to the static slit adjustment used to improve exposure dose uniformity by correcting for the non-uniformity of the projection optics system or the illumination system, the above embodiments uses a comprehensive data collection and analysis component to collect system data (such as inspection data) and to adjust the exposure dose in response to such data. The data collection may be done dynamically during the scanning process, or it may be done before commencement of the process.

The information used to determine the required dose correction could come from several sources, including the results of a photomask or reticle inspection, design simulation and feedback from the step-and-scan system, and other aspects of the projection optics system. The results of a photomask inspection may include the location and extent of a photomask irregularity or defect that could be corrected by a dose adjustment in the region close to the defect. The birefringence or other light-passing qualities of the clear area of a mask may provide data used to determine dose adjustment. Design simulation could be used to determine the level of flare in regions across the photomask and the dose could be adjusted to compensate for the flare.

Feedback from the step-and-scan system could also be used to determine the uniformity of the system illumination and the dose could be adjusted to compensate for any non-uniformities. Other similar sources of dose correction information may also be provided, in response to which dose adjustments are made. These data are analyzed and a determination is made regarding which features of the slit or aperture need to be adjusted. Then, the adjustment is made accordingly by providing signals which provide for individual control of the features that modulate the light intensity through the aperture or slit of the exposure apparatus of the present invention.

Detailed Description of the Drawing

Figure 1A:
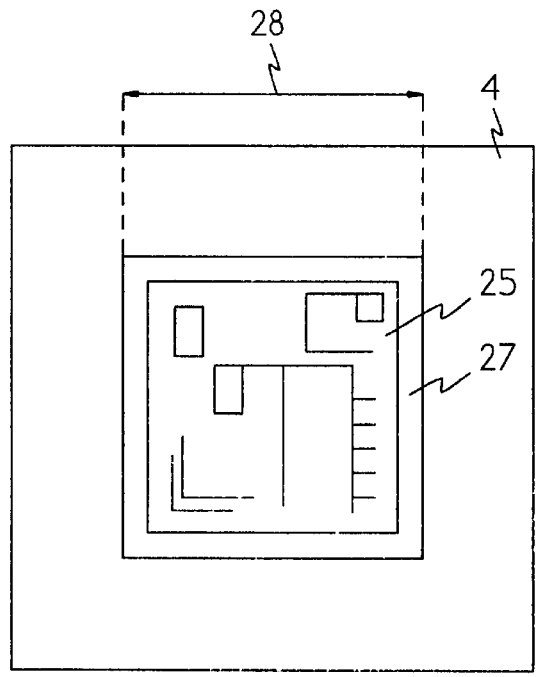
FIG. 1A is a plan view of a conventional reticle.

The nature of the exposure dose adjustment is better understood by first examining a typical step-and-scan exposure system, as shown in FIG. 1. The projection optical system provides a process for projecting a pattern onto an exposed region of a photosensitive substrate or wafer. The projection optical system includes a lamp, laser, or other optical source 2 used to illuminate a photomask or reticle 4 through a condenser lens system 6. The photomask or reticle 4 contains a pattern within a transfer region. As shown in FIG. 1A, the photomask 4 comprises a reticle in the preferred embodiment, which contains a pattern 25 within a transfer region 27 having a width 28.

Now returning to FIG. 1, the projection optical system will be discussed with respect to photomask 4 but it is understood that, in the preferred embodiment, the photomask 4 comprises a reticle having an image which is reduced upon being projected onto the photosensitive substrate and as shown in FIG. 1A. The terms photomask and mask are understood to be interchangeable. The photomask 4 is generally oriented substantially perpendicular to an optical axis 3 of the projection optical system. The pattern 25 on the photomask 4 is the same as the pattern 23 that is desired to be produced on the wafer 10 or photosensitive substrate, but it is typically 4–5 times larger than the desired wafer pattern 23. Some of the light that passes through the photomask 4 is collected by the projection optics 8 and is directed onto the wafer 10, so as to create the pattern or image of the photomask 4 on the wafer 10.

The projection optics 8 typically demagnifies a reticle image so that it is 4–5 times smaller on the wafer 10. In a step-and-scan system, the photomask 4 and the wafer 10 are mounted on translation stages that move relative to the fixed optical system. The photomask 4 is removably affixed to a mask stage 5 and the wafer 10 or substrate is removably affixed to a substrate stage 11. The optical system contains an aperture or slit 16 through which light is allowed to pass to the reticle. In the preferred embodiment, the slit or rectangular aperture 16 is oriented generally perpendicular to the direction of relative movement or scan direction 12. The slit 16 is generally located close to the plane of the photomask 4 or is projected onto that plane by the illumination optics. The direction of movement of the wafer 10 is shown as double arrow 14.

The motion of the photomask 4 relative to the slit 16 and projection optics and the corresponding synchronous movement 14 of the wafer 10 cause the entire photomask pattern to be projected onto the wafer 10, but with only a narrow slit of the photomask 4 projected onto the wafer 10 at any given time. The mask stage 5 and the substrate stage 11 move at a synchronous moving velocity with respect to the fixed slit 16 and optical system. To simplify further discussion, the slit 16 will be considered to move relative to a stationary photomask 4 and wafer 10, but it is understood that in practice the opposite is generally true.

First, the entire mask pattern within the desired transfer region of a reticle is completely exposed by scanning along the one-dimensional scan direction 12 and across the complete one-dimensional width 28 of the transfer region 27 (see FIG. 1A). In this manner, a complete pattern 23 is produced on a die 22. Next, the wafer 10 can be stepped along either or both step directions 18 and 20 by a distance that is at least as large as the die 22 in order to arrive at the next site. Then, the scanning process is repeated to produce another pattern on the wafer 10. These steps and elements constitute a step-and-scan exposure system.

In this type of step-and-scan exposure system, the amount of illumination or the exposure dose that arrives at a point on the wafer 10 is determined by several factors including the percentage transmission of light through the clear regions of the photomask 4, the intensity of the illumination, the size of the slit 16, the speed at which the slit 16 is scanned, and whether an opaque region blocks the light transmission. In a projection optics patterning system, the size of the feature produced on the wafer 10 depends on the amount of the exposure dose because too much light intensity can "bend around" an opaque feature and effectively shrink the dimensions of an opaque region. Similarly, an insufficient exposure dose may prevent total illumination of a clear region of the photomask 4 and projected onto the wafer 10 as such. Therefore, precise control of the dose is very desirable.

Other than the transmission through the photomask 4, which is used to define the features and to determine the dimensions produced on the wafer 10, all of the other factors that influence the dose are generally kept as constant as possible. Some of these factors may be purposely varied, however, to compensate for known variations of other factors. Such variation is illustrated in FIGS. 2A, 2B, and 2C where a defect on the photomask 4 is compensated by adjusting the width of the slit 36 according to the present invention.

Figure 2A:
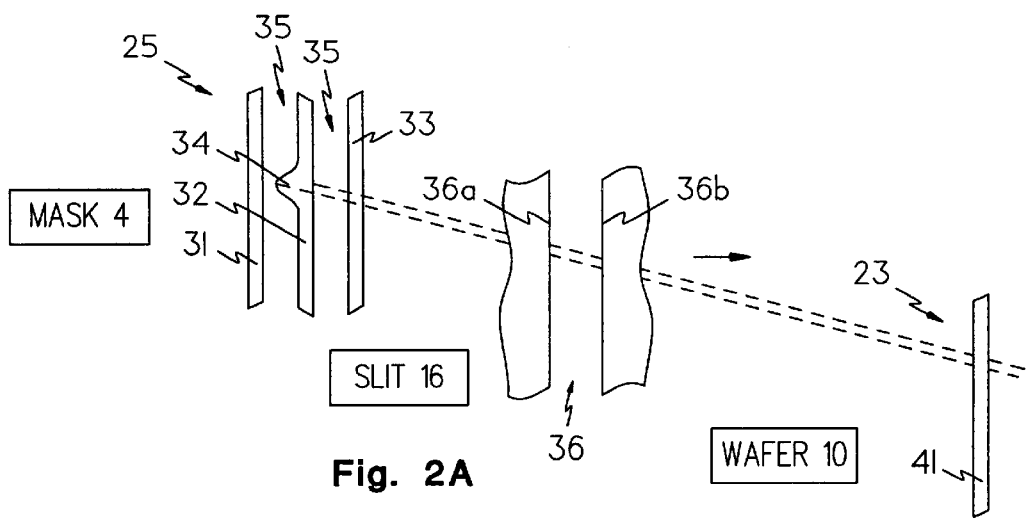
FIGS. 2A, 2B, and 2C present a sequence showing the slit adjustment process of the present invention.
Figure 2B:
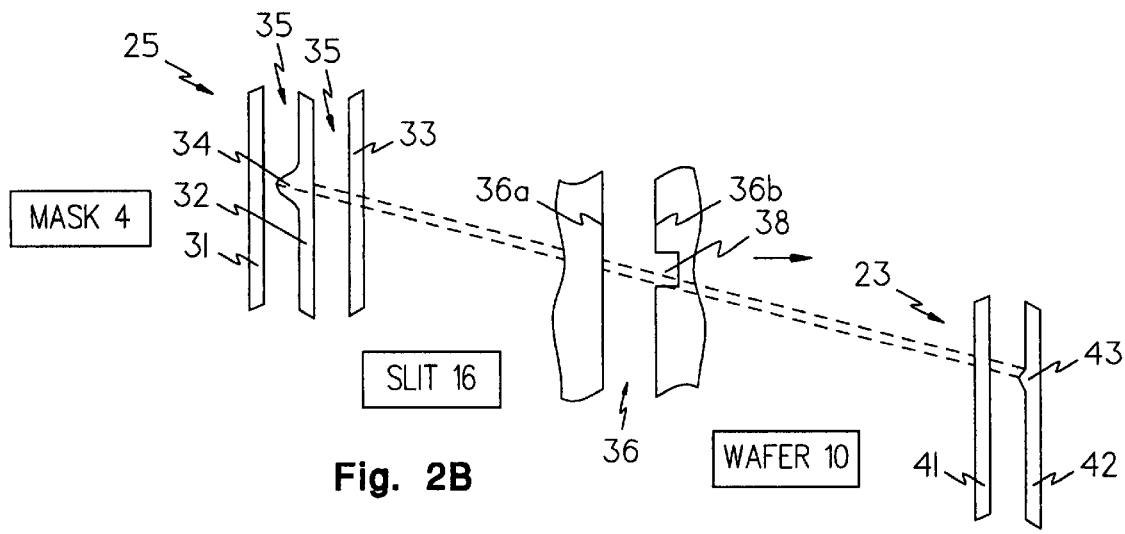
Figure 2C:
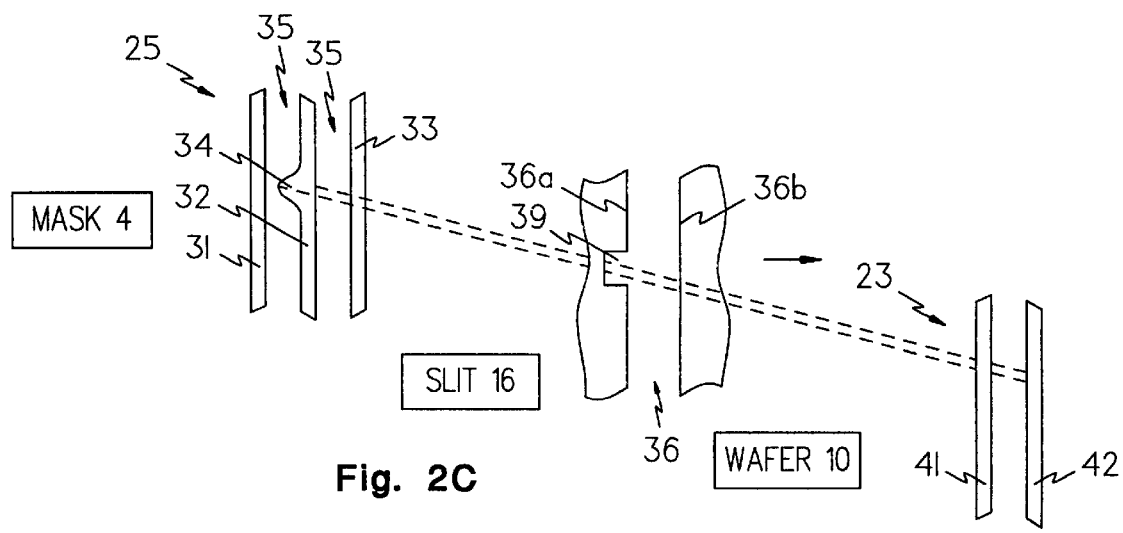

In FIGS. 2A, 2B, and 2C, the photomask pattern 25 consists of three opaque lines 31, 32, and 33 separated by transparent spaces 35. The center opaque line 32 has an undesirable protrusion or defect 34 on one edge. For simplicity, the features of the photomask pattern 25 are shown as the same size as the pattern 23 produced on the wafer 10, although in practice the photomask pattern 25 is generally reduced in size upon being projected onto the wafer 10 to produce the wafer pattern 23.

In FIG. 2A, the slit 36 is positioned so that the first opaque line 31 is projected onto the wafer 10 and begins to create a first exposed line 41 in the photoresist. Center opaque line 32 and third opaque line 33 are not yet projected onto the wafer 10 due to the opaque regions outside the trailing and leading edges 36a and 36b, respectively, of the slit 36. In FIG. 2B, the slit 36 has moved so that its leading edge 36b has now crossed onto the defective center opaque line 32. To compensate for the reduced intensity that will pass through the photomask 4 in the region close to the center opaque line 32 due to the protrusion defect 34, a segment 38 of the leading edge 36b of the slit 36 has been adjusted to allow more light to pass through the slit 36 in the region close to the defect 34. The result of this correction is to increase the exposure dose at this location. This results in a partial correction 43 in the width of the second exposed line 42 in the photoresist. This correction may be in response to inspection data which detected the protrusion defect 34 either dynamically during the scan process or during a prior inspection process.

In FIG. 2C, the slit 36 has moved to the point where the trailing edge 36a is passing over the defective center opaque line 32. Now the leading edge 36b has been made smooth again and a segment 39 of the trailing edge 36a of the slit 36 has been adjusted to allow more light to pass. This process results in the defect 34 being removed from the second exposed line 42 in the photoresist. In practice, various factors such as the size and timing of the slit variation, the accuracy of the defect measurement system, and the mask alignment will determine whether 100% removal of defect 34 is achievable.

Although the apparatus and processes of the present invention have been shown and discussed with respect to increasing exposure dosage at a location within an exposure field in response to an opaque defect on a mask, it is understood that the present invention is not limited to that application. The present invention may conversely be used to decrease dosage at a location within an exposure field in response to a void in the opaque region within a mask pattern.

The edges of the slit may be divided into segments having a length depending on the application. In exemplary embodiments, segment lengths varying from 0.1 micron to 1000 microns may be used. The distance of the lateral displacement of the segments will also vary depending on application, but may vary from 0.05 microns to 500 microns in exemplary embodiments.

The process used to make the dose corrections may also vary depending on the source of the correction information. Several reasons for this exist, the simplest being that the different sources of dose correction information will likely require corrections of different spatial extents. The apparatus feedback information may require, for instance, that the corrections vary by a few percent over about a 1 mm length of the slit. Alternatively, to correct for a defect on a photomask, a dose adjustment of greater than 10% may be required over a slit length of a few microns. The apparatus and processes used to perform these two distinct adjustments would likely be different and comprise another feature of the present invention.

Figure 3:
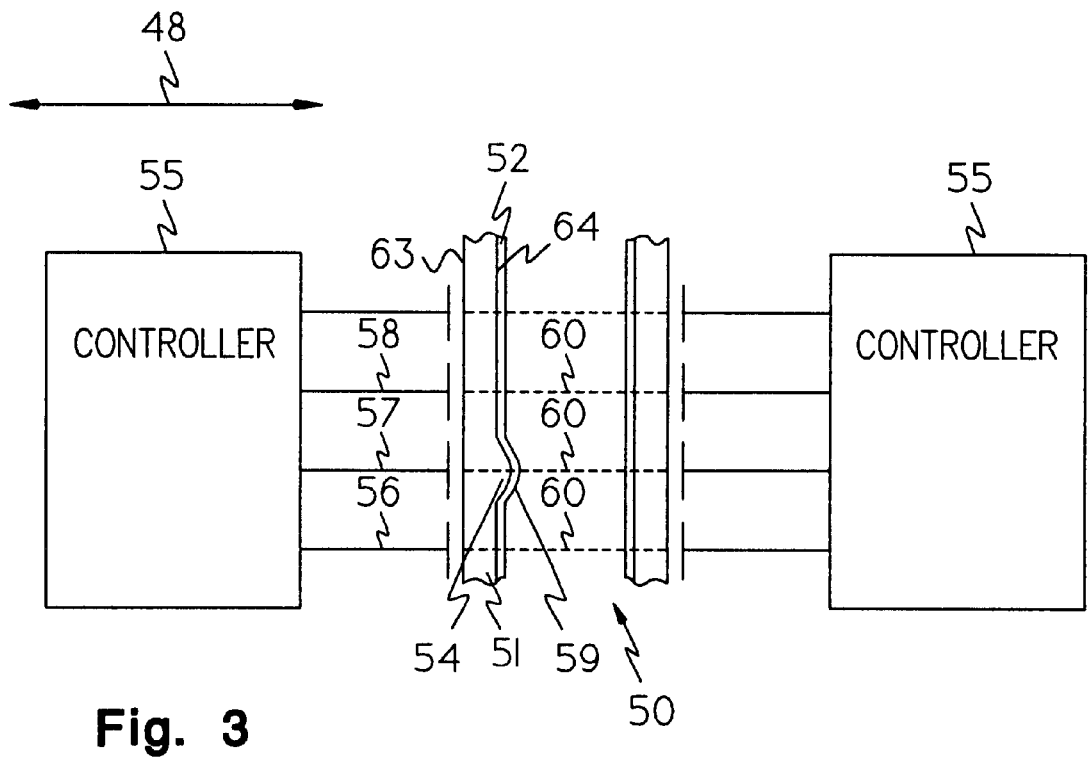
FIG. 3 shows the use of a piezoelectric element to adjust an aligned, segmented slit.

An exemplary slit configuration is shown in FIG. 3. Each edge of the slit 50 includes a piezoelectric material 51, which expands or contracts when a voltage is applied across it. Electrodes are disposed on the inside surface 64 and outside surface 63 of piezoelectric material 51. The outside electrodes 56, 57, and 58 are patterned into separate regions that are electrically connected to slit controller electronics 55 which are capable of switching voltages onto individual electrodes under computer control and in response to collected system data. Inside electrode 52 is held constant, and may be electrically grounded.

In the example shown in FIG. 3, the voltages applied to electrodes 56 and 58 are 0 V (ground), so that the piezoelectric material 51 in the regions close to those electrodes is in its natural state. Electrode 57 has a voltage $V_1$ on it, however, that causes element 54 of piezoelectric material 51 to expand creating a localized bulge 59 of the material. The size of the bulge 59 depends on several factors including the thickness of the piezoelectric material 51 and the voltage applied across the material. Materials and applied voltages may be selected to provide the required lateral displacement.

The bulge 59 of the piezoelectric material 51 has a lateral component along the scan direction 48. This lateral displacement produces a corresponding lateral displacement into slit 50 by the opaque slit segment to which the piezoelectric element 54 is contacted. The displacement of the opaque slit segment into the exposure field blocks the illumination at the localized area and reduces the overall dosage. In the exemplary embodiment, the piezoelectric element 54 and inside electrode 52 are opaque and comprise the opaque slit segment which is disposed laterally into the slit. In an alternate embodiment, the piezoelectric material 51 and inside electrode 52 may be in direct contact with a further opaque member which is displaced into the slit opening by the displacement of the piezoelectric material 51.

In FIG. 3, both edges of the slit 50 are patterned symmetrically with electrodes on one side of the slit 50 aligning directly with electrodes on the other side of the slit 50. Therefore, the individually controlled slit segments are aligned directly across from each other. This arrangement can be seen by the dashed alignment lines 60. In this embodiment, when a set of slit segments disposed opposite each other are each displaced laterally, the modulation effect is doubled. The width and length of the slit 50 may be varied depending on the projection optics and the segmentation of the slit 50 into individual segments can produce segments ranging from 0.1 to 1000 microns in length. The length of the lateral displacement (as above) of the slit segments may vary from 0.05 to 500 microns, in response to the bulge 59 of the piezoelectric material 51.

In an alternative embodiment, mechanisms other than piezoelectric elements may be used to produce the lateral displacement. Furthermore, the lateral displacement may be urged outward away from the slit, thus increasing the exposure area or width of the slit and the effective dose at that location along the length of the slit.

Figure 4:
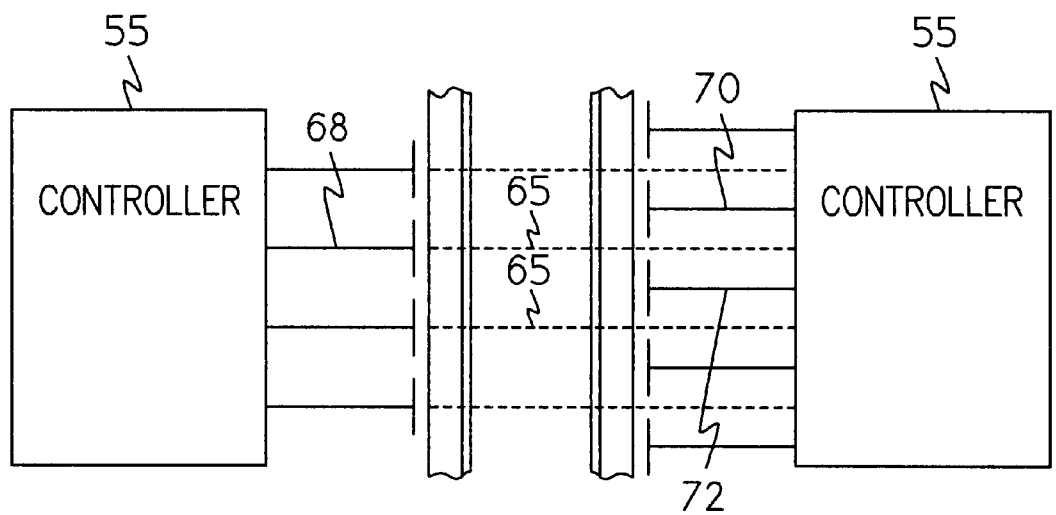
FIG. 4 shows the use of a piezoelectric element to adjust a staggered, segmented slit.

FIG. 4 shows a segmented slit with a piezoelectric material as in FIG. 3, but represents an alternative embodiment. In FIG. 4, the electrodes on opposite edges of the slit are offset. This arrangement can be seen by the dashed alignment lines 65 which show that electrode 68 on the left edge of the slit is aligned between electrodes 70 and 72 disposed on the right edge. This staggered arrangement of the opposed segments allows for reduced or partial modulation across the width of the slit.

Figure 5:
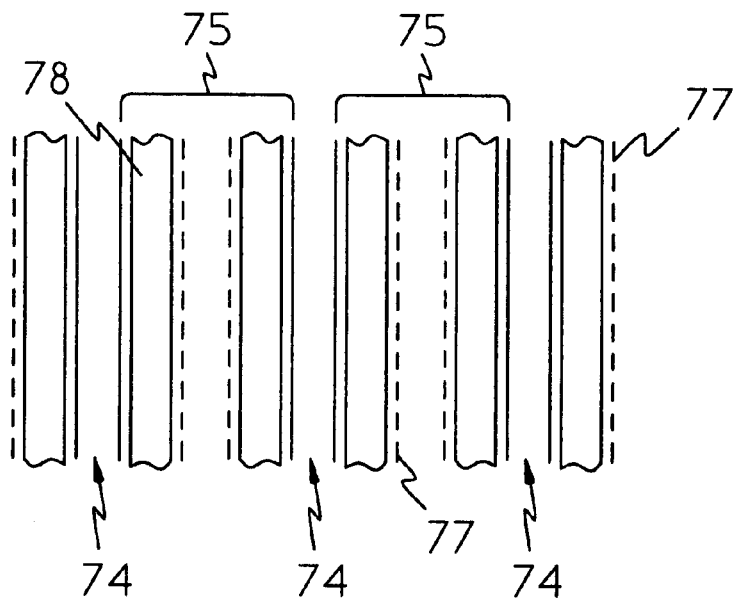
FIG. 5 shows a multiple slit arrangement.
Figure 6:
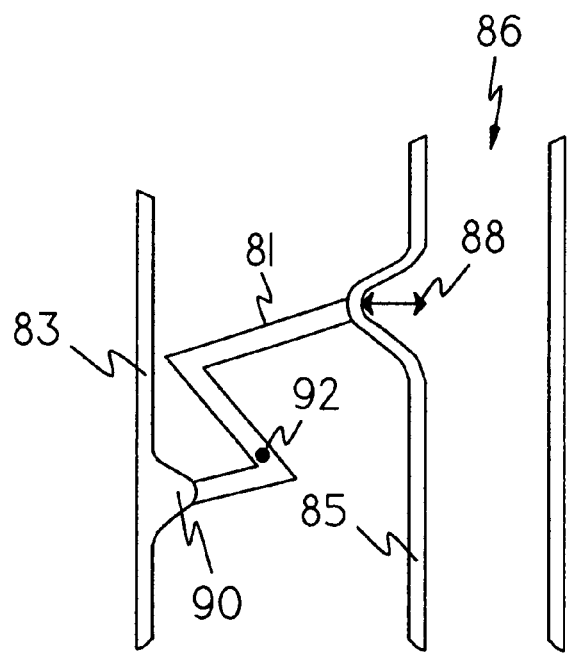
FIG. 6 shows a process to magnify the displacement of a piezoelectric element to produce a greater displacement in the slit segment.

FIGS. 5 and 6 show processes that increase the degree of modulation of the slit. In FIG. 5, multiple slits are used for which each edge of each slit can be deformed. In this configuration, each of the individual slits is narrower than a corresponding singular standard slit or aperture, but the total aperture area is about the same. If the amount of absolute deflection of each edge is the same as in FIGS. 3 and 4, then the total amount of modulation of a corresponding individual position along the length of the slit could be made substantially larger, because such modulation would increase by a factor equal to the number of slits used. If the slit dimension is chosen to be narrow enough so that opposed edges of a slit can be displaced to contact each other, 100% modulation can be achieved.

In FIG. 5, three slits 74 are shown with regions 75 being opaque. Electrodes 77 and piezoelectric members 78 also form opaque regions. This embodiment includes substantially more opaque regions than the clear aperture regions which comprise the exposure field. Therefore, the embodiment is best suited to a step-and-repeat projection system configuration where the slit is projected onto the mask plane. In one embodiment, the illumination may be pre-shaped to pass substantially through the clear regions, minimizing the amount of light that is blocked by the opaque regions. Although only three slits are shown in FIG. 5, it is understood that many slits may be used in order to achieve the desired amount of modulation. In addition, the present invention is not limited to piezoelectric members used as the lateral displacing mechanism in the multiple slit example.

Now turning to FIG. 6, another process used to improve the degree of modulation is shown. The movement of the piezoelectric element 83 is magnified by a lever arm 81. Lever arm 81 has a pivot point 92 and is attached to a deformable membrane 85 which constitutes the edge of the slit 86. In this manner, the extent of lateral displacement 88 of the deformable membrane 85 is greater than an associated lateral component of the displacement 90 of the piezoelectric element 83, and in the opposite direction. Lever arm 81 could be individually made and assembled or made from micro-machining techniques, depending on the desired spatial extent of the dose correction. When micro-machining techniques are used, the piezoelectric elements may be replaced by miniature electrical components in an alternative embodiment.

In FIGS. 3–6, the light intensity which passes through the slit(s) is modulated only at the edge of the slit. In these cases, the edges of the slit are adjusted when the region where a dose adjustment is desired is proximate to the edge of the slit. When the region where a dose adjustment is required is instantaneously within the center of the slit during the scanning process, the edges of the slit are maintained at their normal steady-state conditions.

Figure 7:
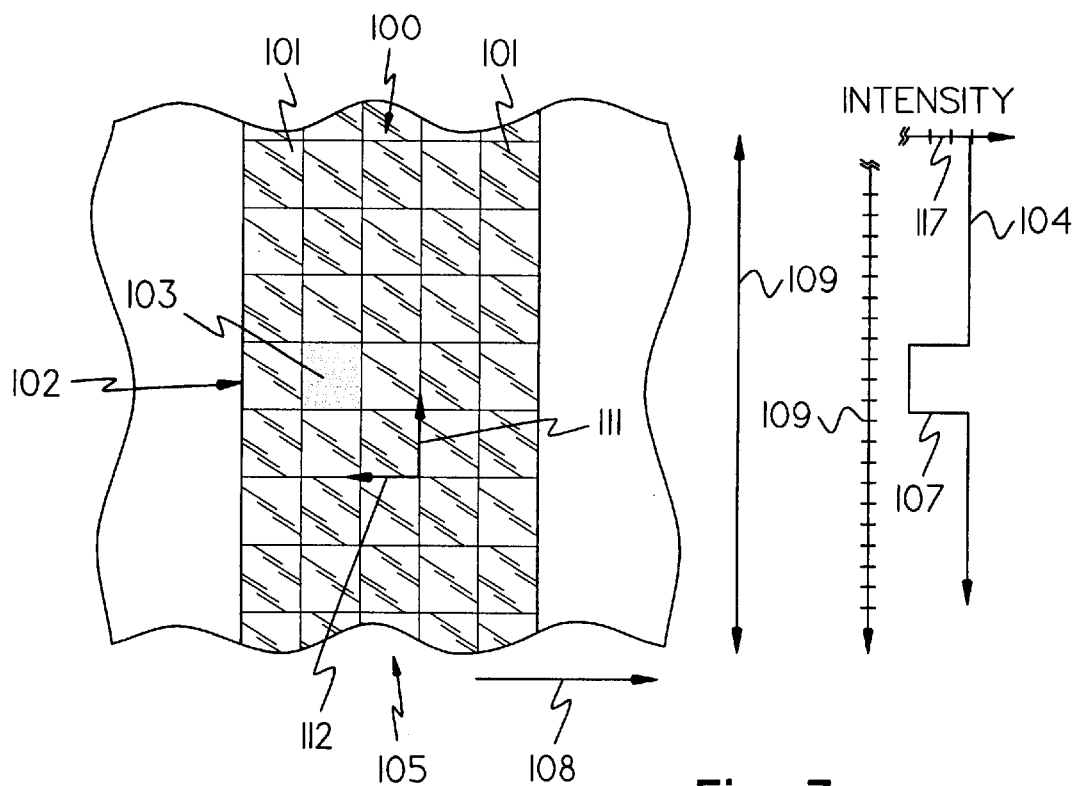
FIG. 7 shows an aperture including an orthogonal LCD array.
Figure 8:
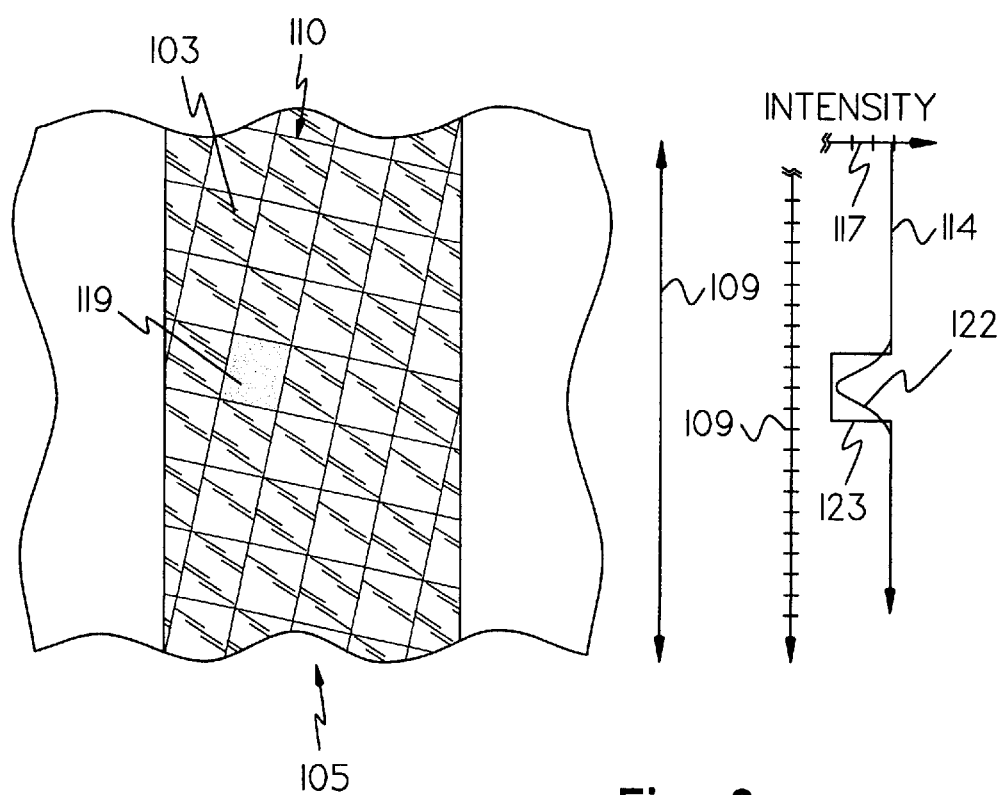
FIG. 8 shows an aperture including a tilted LCD array.
Figure 9:
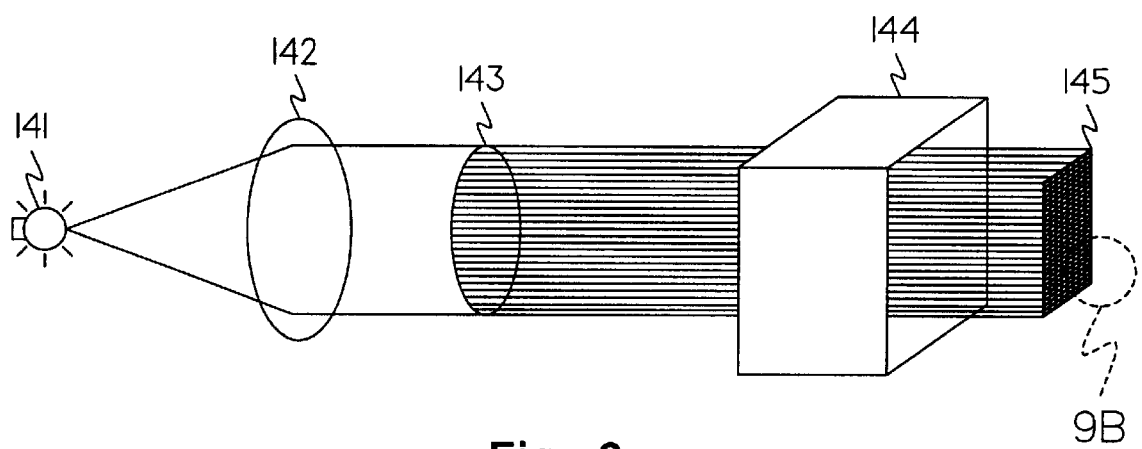
FIG. 9 shows an aperture including an array of optic fibers.

FIGS. 7–9 illustrate processes used to modulate the light intensity across the entire width of the slit, rather than just the edges. In these cases, the modulation can pass across the slit as the region where the dose adjustment is desired also passes across the slit. Increased modulation of the light intensity is achieved in this manner.

FIGS. 7 and 8 show an aperture comprised of a liquid crystal element array. In this arrangement, individually addressable cells or pixels 101 in the liquid crystal array transmit varying amounts of light depending on the voltage applied to the cell. In the steady-state configuration, all of the array elements may be configured to alternatively pass all of the light or some of the light. In one embodiment, the light passing through the slit is reduced by changing the state of some of the pixels 101 to at least partially block the light. In another embodiment, the light passing through the slit may be reduced as in the first embodiment, but could alternatively be increased by changing the state of some of the pixels 101 so that they are more transmissive than in their steady-state configuration.

A third embodiment comprises a configuration in which columns in the array alternate between being normally opaque and normally transmissive. The amount of light passing through the slit can then be increased or reduced by switching the state of the appropriate pixel 101. The benefit of this configuration is that each pixel 101 can be represented by two states (on or off, 1 or 0) which integrates better using digital control electronics than the three states (–1, 0, 1) of the second embodiment. In this manner, light passing through the slit may be attenuated.

In FIG. 7, the array 100 is aligned with the aperture which may be a slit 105. The individual pixels 101 may be orthogonal in the preferred embodiments, but other configurations may be used. The pixels 101 are substantially the same size and shape. Orthogonal array 100 includes two axes 111 and 112. Axis 112 is parallel to scan direction 108, 30 that as the slit 105 passes over a defective region where dose adjustment is required, the pixels 101 along the row 102 over that region can be adjusted sequentially as the defect passes under the pixels 101. The amount of required dose adjustment determines the number of pixels 101 in the row 102 to be adjusted. The scan direction 108 is perpendicular to the slit 105 and along the direction of axis 112 and row 102 of the array 100.

During the exposure scan, the light traverses five individual pixels 101 as it passes through the aperture or slit 105 being scanned and reaches the surface being exposed. The minimum amount of dose adjustment can be achieved simply by switching one pixel 103. The maximum adjustment is achieved by switching all of the pixels 101, which could in principle adjust the dose by 100% at that location along the slit 105. The integrated intensity profile of the amount of light that passes through the slit 105 onto a line on the mask (or wafer) at a given location along the length 109 of the slit 105 during the full scan is shown as curve 104.

Curve 104 represents the intensity 117 along the length 109 of the slit 105. This curve 104 has a step depression 107 that is one pixel wide and has an intensity of ⅘ of the normal intensity. This represents the intensity reduced by ⅕, due to one out of five of the normally fully transmissive pixels (pixel 103) in row 102 being turned opaque in response to data collected, for example a detected defect, as the slit 105 passes over a corresponding part of the photosensitive substrate.

In the exemplary embodiment shown in FIG. 7 and as discussed above, five pixels are shown disposed across the width of the slit. However, the present invention is not intended to be limited to such an arrangement. Rather, the width of the slit may be divided into any suitable number of pixels.

In FIG. 8, the array 110 is tilted within the slit 105. This configuration offers additional benefits. The first is that the "dead" regions between rows of pixels 101 is averaged across the slit 105. A second benefit is that the effective pixel size can be reduced, creating a larger modulation in a smaller area, at the expense of a larger area where there is small modulation. The individual pixels 103 may be orthogonal or trapezoidal in the preferred embodiments, but other configurations may be used. The pixels 101 are substantially the same size and shape.

Intensity curve 114 shows the effect upon intensity modulation. As in FIG. 7, if one normally clear pixel 119 is turned opaque while the slit 105 scans over that point in the exposure field, a depression 122 in the intensity curve 114 will result. Comparing the step depression 107 produced by the orthogonal array 100 of FIG. 7, as represented by dotted line 123 of FIG. 8, with the depression 122 produced by the tilted array 110, it can be seen that the intensity profile is smoother with a darker, narrow region in the center for the tilted array 110. More "fine-tuning" of the image is thus achieved.

Figure 9A:
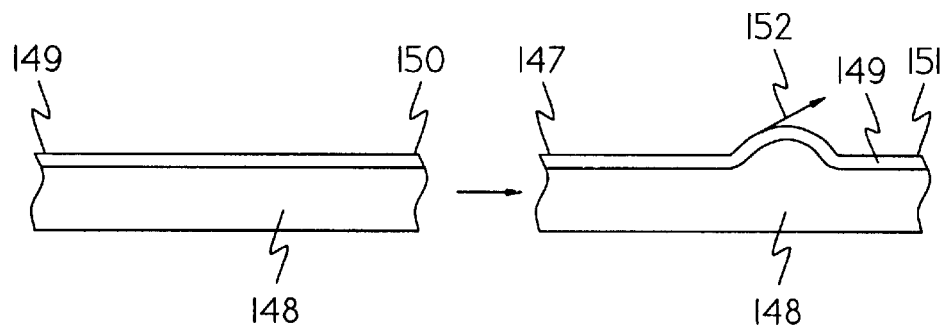
FIGS. 9A and 9B are expanded sections of FIG. 9.
Figure 9B:
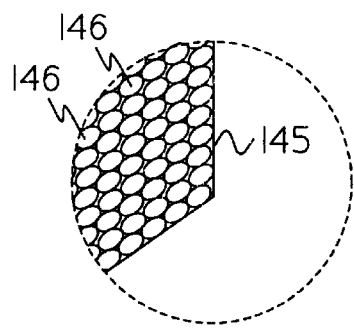

Another process to modulate the light intensity across the slit is through the use of a fiber optic bundle as shown in FIG. 9. Light from source 141 is focused onto a circular bundle of optical fibers 143 by a condenser lens 142. The fibers may be randomized to remove source variations and then converted into a rectangular array, passed through a modulation device 144, and terminated at a rectangular slit 145. In the slit 145, the fibers 146 may be arranged in orthogonal arrays or tilted arrays, similar to the liquid crystal elements, and as shown in FIG. 9B. FIG. 9B is an enlarged, cross-sectional view taken along a plane of the rectangular slit 145.

The modulation device individually addresses and modulates each fiber. The modulation may be achieved using various processes including a small bending of the fiber in an exemplary embodiment. This bending causes light to be coupled out of the fiber, resulting in a reduction in the dose delivered to the slit 145 at the corresponding location. This bending could be caused by fiber 149 being attached to a bending piezoelectric element 148, such as a bimorph, as shown in FIG. 9A. FIG. 9A represents an expanded section of the fibers. When the bimorph is flat, all of the light that enters the fiber 149 passes through the fiber 149 and exits the end 150 of the fiber 149. When the bimorph is bent, some of the light 152 is coupled out of the fiber 149, so that the intensity at the exit 151 is lower than the intensity at the entrance 147 of the fiber 149. In this manner, the intensity is likewise reduced at the plane of the rectangular slit 145. Various other evanescent coupling processes could also be used in alternative embodiments.

Although described above with respect to optical fibers or pixels within an LCD array, it is understood that other arrays of individually controllable elements may be used in alternative embodiments.

Figure 10:
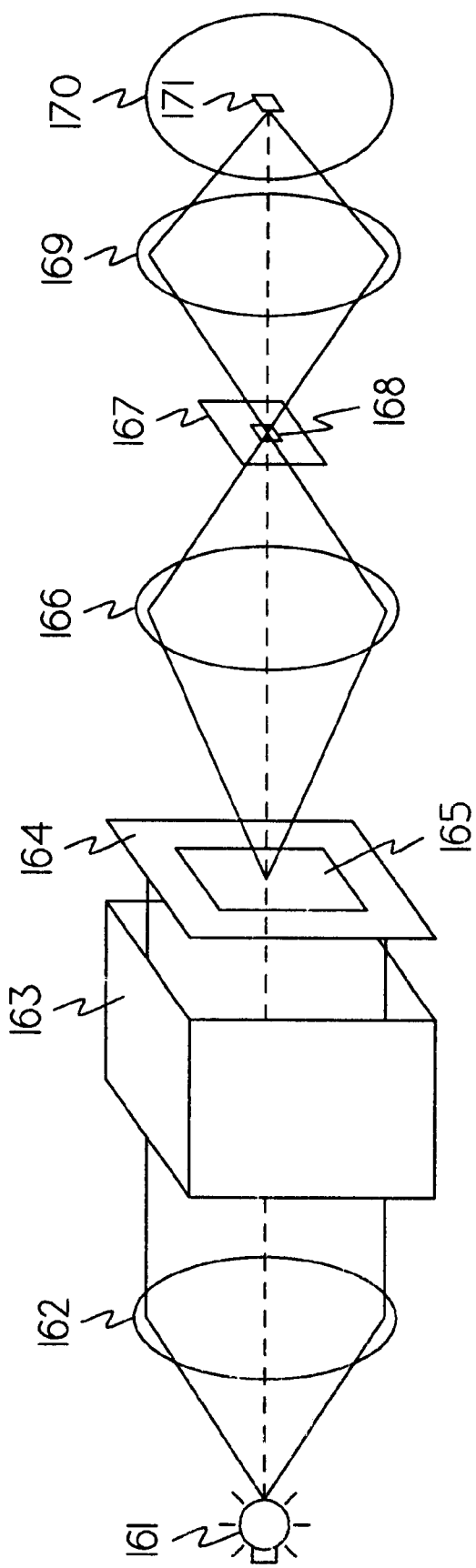
FIG. 10 shows an optical system in which the transfer region is projected and demagnified onto a substrate.

Many of the processes described to modulate the light intensity at the edge of a slit or across a slit would benefit from the slit being physically larger than its projection on the mask and wafer. This configuration allows for easier construction of mechanical parts used in the apparatus. Per this technique, the slit is demagnified onto the mask plane as shown in FIG. 10. Light source 161 is directed into conditioning optics 163 by a condenser lens 162. Opaque regions 164 and one or more clear regions 165 define the configuration of the aperture through which light is allowed to pass. Light coming from the clear regions 165 is then collected by illumination optics 166 and focused as image 168 on the patterned surface of photomask 167. This creates a demagnified image of the aperture defined by clear regions 165 on the photomask 167. The photomask 167 is then imaged onto the wafer 170 by projection optics 169, creating a second demagnified image 171 of the slit on wafer 170.

Another feature of the present invention is directed to a mask-less step-and-scan exposure system. Any of the above-described embodiments, for which 100% modulation can be achieved across the width of a slit or aperture at a given location, may be used to produce this feature. Examples of such embodiments include the multiple-slit configuration in which a location along a slit can effectively be "pinched-off" and completely block light, as described in conjunction with FIG. 5, and the array disposed across an aperture as described in conjunction with FIG. 7.

The mask-less feature of the present invention contemplates the apparatus and processes as above, except that the mask or reticle is not needed and the data upon which exposure dose is determined includes pre-programmed pattern data. By varying the percentage of light transmitted through an exposure field from 100% to 0%, clear and opaque mask regions are effectively simulated. As the aperture or exposure field is scanned across the surface of the photosensitive substrate, a pattern may be created by simply programming 100% transmission or 0% transmission for a given location to produce an integrated pattern. In the preferred embodiment, an orthogonal array of LCD elements disposed across an exposure area defined by an aperture may be used, but other configurations may also be used.

Although illustrated and described above with reference to certain specific examples, the present invention is nevertheless not intended to be limited to the detail shown. Rather, various modifications may be made to the details within the scope and range of equivalence of the claims and without departing from the spirit of the invention. The scope of the present invention is expressed by the appended claims.

What is claimed:

1. A projection exposure apparatus for projecting patterns of a mask on a photosensitive substrate by a step-and-scan exposure process, said apparatus comprising:

a projection optical system for projecting said patterns on an exposed region of said photosensitive substrate, said patterns being formed within a transfer region on said mask;

a mask stage for making one-dimensional movements over a range equal to or larger than a one-directional width dimension of said mask transfer region in a state where said mask is held substantially perpendicular to an optical axis of said projection optical system;

a substrate stage for one-dimensionally moving said photosensitive substrate at a velocity synchronized with a moving velocity of said mask stage in a one-dimensional moving direction of said mask stage;

an illuminating means for illuminating said mask transfer region with illumination light for an exposure through an aperture region, said aperture region defined by a slit having opposed, segmented light-interrupting edges, each edge comprised of a plurality of slit segments, each slit segment independently adjustable; and adjusting means for independently adjusting each said slit segment, wherein for each slit segment of said plurality of slit segments said adjusting means includes data receiving means for receiving data and lateral displacement means for laterally displacing said slit segment, said lateral displacement means responsive to said data, said data comprises inspection data of said patterns, measured non-uniformities of said projection optical system, and measured non-uniformities of said illumination light.

2. The projection exposure apparatus as in claim 1, wherein said slit is disposed perpendicular to said one-dimensional moving direction.

3. The projection exposure apparatus as in claim 1, wherein said transfer region of said mask includes said patterns and a light transmissive medium, and said data includes measured non-uniformities of a characteristic of said light transmissive medium.

4. The projection exposure apparatus as in claim 3, wherein said characteristic comprises birefringence.

5. The projection exposure apparatus as in claim 1, wherein said transfer region of said mask includes said patterns and a light transmissive medium, and said data includes measurements of an intensity of light passing through said light transmissive medium.

6. The projection exposure apparatus as in claim 1, wherein said lateral displacement means is said plurality of piezoelectric elements.

7. The projection exposure apparatus as in claim 6, wherein each said piezoelectric element deforms in response to an electrical signal applied thereto, and said deformation urges said lateral displacement.

8. The projection exposure apparatus as in claim 7, wherein said deformation includes lateral motion and said lateral displacement means includes amplification means for urging a lateral displacement greater than said lateral motion.

9. The projection exposure apparatus as in claim 1, wherein each segment of said plurality of slit segments is about 100 microns long and said lateral displacement means displaces each segment a maximum distance of approximately 50 microns.

10. The projection exposure apparatus as in claim 1, wherein each segment of said plurality of slit segments is about 1 millimeter long and said lateral displacement means displaces each segment a maximum distance of approximately 500 microns.

11. The projection exposure apparatus as in claim 1, wherein each segment of said plurality of slit segments is about 1 micron long and said lateral displacement means displaces each segment a maximum distance of approximately 0.5 microns.

12. The projection exposure apparatus as in claim 1, wherein each segment of said plurality of slit segments is about 0.1 micron long and said lateral displacement means displaces each segment a maximum distance of approximately 0.05 microns.

13. The projection exposure apparatus as in claim 1, wherein:
one edge is comprised of a first plurality of slit segments, each slit segment of said first plurality of slit segments having a first length,
another edge is comprised of a second plurality of slit segments, each slit segment of said second plurality of slit segments having said first length; and
said first plurality of slit segments is aligned with said second plurality of slit segments along said moving direction.

14. The projection exposure apparatus as in claim 1, wherein:
one edge is comprised of a first plurality of slit segments, each slit segment of said first plurality of slit segments having a first length,
another edge is comprised of a second plurality of slit segments, each slit segment of said second plurality of slit segments having said first length; and
said first plurality of slit segments is staggered with respect to said second plurality of slit segments along said moving direction.

15. The projection exposure apparatus as in claim 1, wherein said projection optical system further comprises means for uniformly reducing said patterns upon projecting said patterns on said exposed region of said photosensitive substrate.

16. The projection exposure apparatus as in claim 1, wherein said adjusting means includes a plurality of piezoelectric elements.

17. A projection exposure apparatus for projecting patterns of a mask on a photosensitive substrate by a step-and-scan exposure process, said apparatus comprising:
a projection optical system for projecting said patterns on an exposed region of said photosensitive substrate, said patterns being formed within a transfer region on said mask;
a mask stage for making one-dimensional movements over a range at least equal to a one-directional width dimension of said mask transfer region in a state where said mask is held substantially perpendicular to an optical axis of said projection optical system;
a substrate stage for one-dimensionally moving said photosensitive substrate at a velocity synchronized with a moving velocity of said mask stage in said one-dimensional moving direction of said mask stage;
an illuminating means for illuminating said mask transfer region with illumination light for an exposure through an aperture region, said aperture region defined by a plurality of slits, each having opposed, segmented light-interrupting edges, each edge comprised of a plurality of slit segments, each slit segment independently adjustable; and
adjusting means for independently adjusting each said slit segment, wherein for each slit segment, said adjusting means includes data receiving means for receiving data, and lateral displacement means for laterally displacing said slit segment, said lateral displacement means responsive to said data, said data comprises inspection data of said patterns, measured non-uniformities of said projection optical system, and measured non-uniformities of said illumination light.

18. A projection exposure apparatus for projecting patterns of a mask on a photosensitive substrate by a step-and-scan exposure process, said apparatus comprising:
a projection optical system for projecting said patterns on an exposed region of said photosensitive substrate, said patterns being formed within a transfer region on said mask;
a mask stage for making one-dimensional movements over a range at least equal to a one-directional width dimension of said mask transfer region in a state where said mask is held substantially perpendicular to an optical axis of said projection optical system;
a substrate stage for one-dimensionally moving said photosensitive substrate at a velocity synchronized with a moving velocity of said mask stage in said one-dimensional moving direction of said mask stage;
an illuminating means for illuminating said mask transfer region with illumination light for an exposure through an aperture;
an exposure field bounded by a plurality of light-interrupting edges, defining said aperture, and comprised of an array of individually controllable, light-transmissive elements; and
control means for independently controlling each element of said array, wherein for each light-transmissive element of said array, said control means includes data receiving means for receiving data and attenuation means for controlling the transmissiveness of said light transmissive element, said data comprises inspection data of said patterns, and said data comprises measured non-uniformities of said projection optical system.

19. The projection exposure apparatus as in claim 18, wherein said elements comprise liquid crystal elements.

20. The projection exposure apparatus as in claim 18, wherein said elements comprise optic fibers.

21. The projection exposure apparatus as in claim 18, wherein said array comprises an optical fiber bundle.

22. The projection exposure apparatus as in claim 18, wherein said array comprises an orthogonal array and said elements are of substantially equal size.

23. The projection exposure apparatus as in claim 22, wherein an axis of said orthogonal array is disposed orthogonal to said one-dimensional moving direction.

24. The projection exposure apparatus as in claim 22, wherein an axis of said orthogonal array is tilted with respect to said one-dimensional moving direction.

25. The projection exposure apparatus as in claim 18, wherein each said element is trapezoidal in shape.

26. A projection exposure apparatus for projecting patterns of a mask on a photosensitive substrate by a step-and-scan exposure process, said apparatus comprising:
a projection optical system for projecting said patterns on an exposed region of said photosensitive substrate, said patterns being formed within a transfer region on said mask;
a mask stage for making one-dimensional movements over a range equal to or larger than a one-directional width dimension of said mask transfer region in a state where said mask is held substantially perpendicular to an optical axis of said projection optical system;
a substrate stage for one-dimensionally moving said photosensitive substrate at a velocity synchronized with a moving velocity of said mask stage in a one-dimensional moving direction of said mask stage;
an illuminating means for illuminating said mask transfer region with illumination light for an exposure through an aperture region, said aperture region defined by a slit disposed perpendicular to said one-dimensional moving direction and having opposed, segmented light-interrupting edges, each edge comprised of a plurality of slit segments, each slit segment independently adjustable; and adjusting means for independently adjusting each said slit segment;

wherein for each slit segment of said plurality of slit segments, said adjusting means includes data receiving means for receiving data and lateral displacement means including a plurality of piezoelectric elements for laterally displacing said slit segment, said lateral displacement means responsive to said data, and said data comprises inspection data of said patterns, measured non-uniformities of said projection optical system, and measured non-uniformities of said illumination light.

27. A process for projecting patterns of a mask onto a photosensitive substrate by use of a projection optical system illuminating said mask through a slit, said mask including said patterns and a light transmissive medium, and said slit defined by a pair of opposed light-interrupting edges and including an exposure area, said process comprising the steps of:

a) providing one-dimensional motion between a first unit including said aperture and said projection optical system and a second unit including said photosensitive substrate and said mask;

b) projecting light through said slit, each light-interrupting edge comprised of a plurality of slit segments, each slit segment individually adjustable;

c) obtaining system data;

d) analyzing said system data to identify which of said slit segments require lateral displacement to compensate for non-uniformities of said system data; and e) modifying said exposure area to compensate for said non-uniformities by individually laterally displacing identified slit segments determined by said analyzing and in response to said system data, wherein said step of obtaining system data includes inspecting said mask, monitoring a uniformity of said projection optical system, and monitoring a uniformity of said light transmissive medium.

28. A process for projecting patterns of a mask onto a photosensitive substrate by use of a projection optical system illuminating said mask through an aperture, said mask including said patterns and a light transmissive medium, and said opening defined by an exposure area bounded by a plurality of light-interrupting edges, said process comprising the steps of:

a) providing one-dimensional motion between a first unit including said aperture and said projection optical system and a second unit including said photosensitive substrate and said mask;

b) projecting light through said exposure area comprised of an array of light-transmissive elements, said array of light-transmissive elements controllable by a plurality of piezoelectric elements;

c) obtaining system data; and d) controlling a degree of light transmission of each said element in response to said system data, wherein said step of obtaining system data includes inspecting said mask, monitoring a uniformity of said projection optical system, and monitoring a uniformity of said light transmissive medium.

29. The process as in claim 28, wherein said array is an orthogonal array and said elements are substantially identically shaped and sized.

30. The process as in claim 29, wherein said array comprises an orthogonal array having an axis parallel to a direction of said one-dimensional motion.

31. The process as in claim 29, wherein said array comprises an orthogonal array having an axis tilted with respect to said one-dimensional motion.

32. An apparatus for projecting a pattern onto a photosensitive substrate, comprising:

a projection optical system illuminating said photosensitive substrate through an opening, said opening bounded by a plurality of light-interrupting edges and defining an exposure area, said exposure area comprised of an array of light-transmissive elements, each element individually controllable;

means for providing one-dimensional motion between said photosensitive substrate and a unit including said aperture and said projection optical system;

controlling means for controlling a degree of light transmission through each of said elements; and means for obtaining system data, said controlling means being responsive to said system data, wherein said system data comprises programmed data for forming an integrated circuit pattern on said photosensitive substrate.

33. The apparatus for projecting a pattern onto a photosensitive substrate as in claim 32, wherein each said element is trapezoidal in shape and substantially equally sized.

34. The apparatus for projecting a pattern onto a photosensitive substrate as in claim 32, wherein said array is orthogonal in shape, and each said element is substantially equally sized.

35. The apparatus for projecting a pattern onto a photosensitive substrate as in claim 34, wherein said array includes an axis parallel to a direction of said one-dimensional motion.

36. The apparatus for projecting a pattern onto a photosensitive substrate as in claim 34, wherein said array includes an axis forming a non-90 degree angle with a direction of said one-dimensional motion.

* * * * *